United States Patent
Kim

(10) Patent No.: US 8,545,082 B2
(45) Date of Patent: Oct. 1, 2013

(54) LIGHT EMITTING APPARATUS AND LIGHTING SYSTEM

(75) Inventor: Geun Ho Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 405 days.

(21) Appl. No.: 12/833,102

(22) Filed: Jul. 9, 2010

(65) Prior Publication Data

US 2011/0090711 A1    Apr. 21, 2011

(30) Foreign Application Priority Data

Oct. 19, 2009   (KR) .................. 10-2009-0099336

(51) Int. Cl.
| F21V 7/04 | (2006.01) |
| F21V 3/00 | (2006.01) |
| H01L 33/00 | (2010.01) |

(52) U.S. Cl.
USPC .................. 362/611; 257/98; 362/311.02

(58) Field of Classification Search
USPC .......................................... 362/611; 257/98
See application file for complete search history.

(56) References Cited

U.S. PATENT DOCUMENTS

| 5,001,609 A * | 3/1991 | Gardner et al. ............... 362/555 |
| 2003/0151361 A1 | 8/2003 | Ishizaka |
| 2008/0035942 A1 * | 2/2008 | Kim et al. .................. 257/98 |
| 2008/0179616 A1 | 7/2008 | Lee et al. |
| 2009/0194776 A1 | 8/2009 | Pachler |
| 2010/0133560 A1 * | 6/2010 | Kim et al. .................. 257/89 |

FOREIGN PATENT DOCUMENTS

| EP | 1887637 A2 | 2/2008 |
| JP | 2002-94122 A | 3/2002 |
| JP | 2003-234509 | 8/2003 |
| KR | 10-2007-0098195 A | 10/2007 |
| KR | 10-2008-0065451 A | 7/2008 |
| WO | WO 2009/132833 A2 | 11/2009 |

* cited by examiner

*Primary Examiner* — Anh Mai
*Assistant Examiner* — Michael Santonocito
(74) *Attorney, Agent, or Firm* — Birch, Stewart, Kolasch & Birch, LLP

(57) ABSTRACT

A light emitting apparatus including a body including a first cavity; a first electrode and a second electrode on the body; a light emitting device disposed in the first cavity and being electrically connected with the first and the second electrodes; and a first molding member disposed in the first cavity, and including a fluorescent material. Further, a height 'a' of the light emitting device and a depth 'y' of the first cavity satisfy a relation 1.5a≤y≤3.0a, and the height 'a' and a horizontal distance 'x' from an upper outer edge of the light emitting device to an inner surface of the body forming the first cavity satisfy a relation 0.5a≤x≤1.5a.

20 Claims, 7 Drawing Sheets

EXPERIMENT 1 a:100μm, x:70μm, y:200μm
EXPERIMENT 2 a:100μm, x:300μm, y:200μm
EXPERIMENT 3 a:100μm, x:100μm, y:400μm

LIGHT EMITTING APPARATUS AND LIGHTING SYSTEM

CROSS-REFERENCE TO A RELATED APPLICATION

The present application claims priority under 35 U.S.C. 119 and 35 U.S.C. 365 to Korean Patent Application No. 10-2009-0099336 filed on Oct. 19, 2009, which is hereby incorporated by reference in its entirety.

BACKGROUND OF THE INVENTION

1. Field of the Invention

The present disclosure relates to a light emitting apparatus and a corresponding lighting system.

2. Discussion of the Background

A light emitting diode (LED) is one of a light emitting device that convert electric energy to light. In comparison with other light sources such as a fluorescent lamp and an incandescent lamp, the LED is advantageous because of low power consumption, a long lifetime, a fast response time, safety, and environment-friendliness. In fact, many traditional light sources are now being replaced with LEDs. Also, LEDs are used as a light source in lighting systems such as liquid crystal displays, electric light signs, and streetlights.

Further, a light emitting apparatus including LEDs emits white light by using a combination of Red, Green and Blue LEDs. However, the background light emitting apparatus have color variation problems making it difficult to obtain a high-quality white light.

SUMMARY OF THE INVENTION

Accordingly, one object of the present invention is to address the above-noted and other problems.

Another object of the present invention is to provide a light emitting apparatus and a corresponding lighting system which emits light with less color variation.

Yet another object of the present invention is to provide a light emitting apparatus and a corresponding lighting system which achieves a high luminance efficiency.

To achieve these and other advantages and in accordance with the purpose of the present invention, as embodied and broadly described herein, the present invention provides in one aspect a light emitting apparatus including a body including a first cavity; a first electrode and a second electrode on the body; a light emitting device disposed in the first cavity and being electrically connected with the first and the second electrodes; and a first molding member disposed in the first cavity, and including a fluorescent material. Further, a height 'a' of the light emitting device and a depth 'y' of the first cavity satisfy a relation $1.5a \leq y \leq 3.0a$, and the height 'a' and a horizontal distance 'x' from an upper outer edge of the light emitting device to an inner surface of the body forming the first cavity satisfy a relation $0.5a \leq x \leq 1.5a$.

In another aspect, the present invention provides a lighting system including a light emitting module including a substrate and a light emitting apparatus mounted on the substrate. Further, the light emitting apparatus includes a body including a first cavity; a first electrode and a second electrode on the body; a light emitting device disposed in the first cavity and being electrically connected with the first and the second electrodes; and a first molding member disposed in the first cavity, and including a fluorescent material. In addition, a height 'a' of the light emitting device and a depth 'y' of the first cavity satisfy a relation $1.5a \leq y \leq 3.0a$, and the height 'a' and a horizontal distance 'x' from an upper outer edge of the light emitting device to an inner surface of the body forming the first cavity satisfy a relation $0.5a \leq x \leq 1.5a$.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by illustration only, and thus are not limitative of the present invention, and wherein.

DETAILED DESCRIPTION OF THE EMBODIMENTS

Reference will now be made in detail to the preferred embodiments of the present invention, examples of which are illustrated in the accompanying drawings.

In the following description of the embodiments of the present invention, when a layer (or film), a region, a pattern, or a structure is referred to as being 'on/above/over/upper' substrate, each layer (or film), a region, a pad, or patterns, it can be directly on substrate, each layer (or film), the region, the pad, or the patterns, or intervening layers may also be present. Further, whether a layer is disposed on or under another layer will be described with respect to the drawings.

Figure 1:
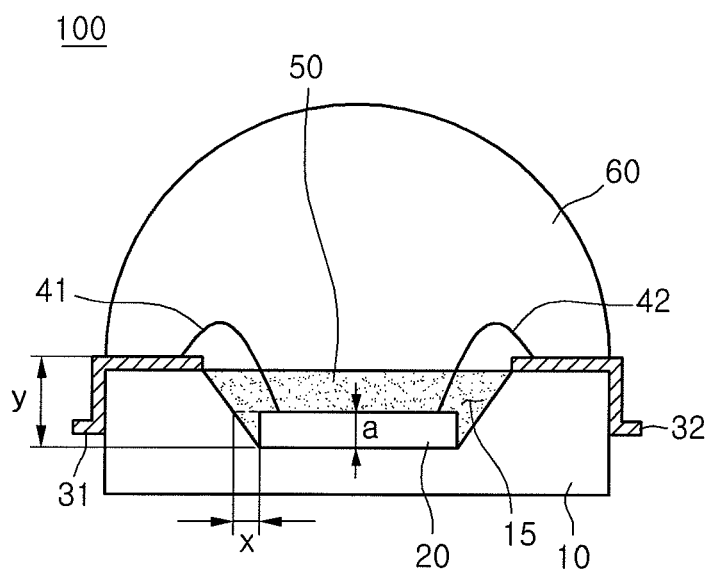
FIG. 1 is a sectional view of a light emitting apparatus according to a first embodiment of the present invention.
Figure 2:
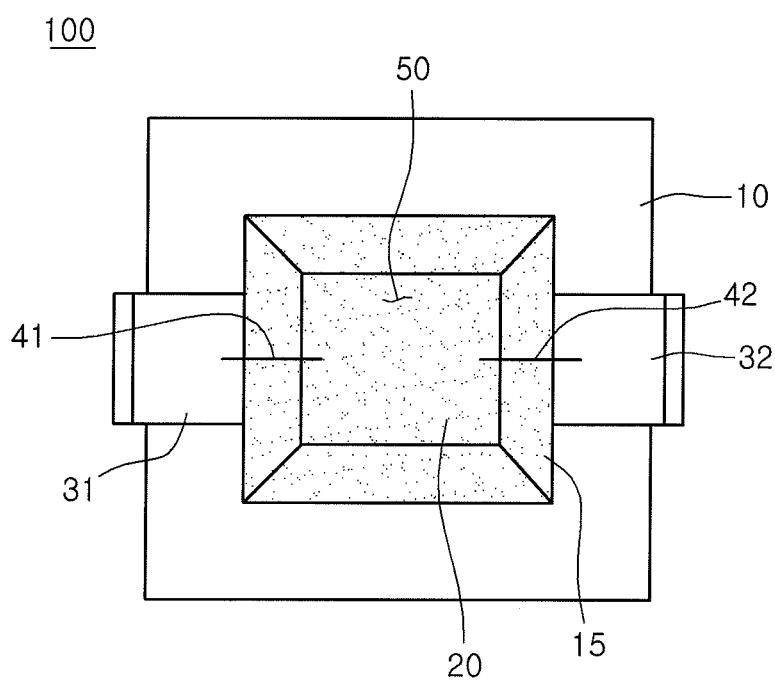
FIG. 2 is a top view of the light emitting apparatus according to the first embodiment of the present invention.

First, FIG. 1 is a sectional view of the light emitting apparatus, and FIG. 2 is a top view of the light emitting apparatus according to the first embodiment of the present invention. As shown in FIGS. 1 and 2, the light emitting apparatus 100 includes a body 10 including a cavity 15, a first electrode 31 and a second electrode 32 disposed on the body 10, a light emitting device 20 disposed in the cavity 15 of the body 10 and electrically connected with the first and the second electrodes 31 and 32, a first molding member 50 disposed in the cavity 15 and configured to enclose the light emitting device 20, and a second molding member 60 disposed on the first molding member 50 and the body 10.

The first and second electrodes 31 and 32 may be disposed on the outside of the cavity 15 rather than in the cavity 15 of the body 10. For example, the first and second electrodes 31 and 32 may be formed on an upper peripheral surface of the body 10 and extended to a lateral surface of the body 10.

In addition, a depth 'y' of the cavity 15 and a horizontal distance 'x' from an upper outer edge of the light emitting device 20 to an inner surface of the body 10 forming the cavity 15 are designed to have a predetermined relation with a height 'a' of the light emitting device 20 so that a color variation of light emitted from the light emitting apparatus 100 is reduced.

In addition, the first molding member 50 may contain a fluorescent material. In more detail, the fluorescent material emits light by being excited by the light emitted from the light emitting device 20. For example, when the light emitting device 20 uses blue LEDs emitting blue light, the fluorescent material is preferably a yellow fluorescent material which emits yellow light when excited by the blue light from the light emitting device 20.

Also, the second molding member 60 may be formed into a dome shape so as to improve a light extraction efficiency of the light emitting apparatus 100. For example, an upper surface of the first molding member 50 may be flat whereas an upper surface of the second molding member 60 has an upward convex shape. The body 10 may also be formed by accumulating a plurality of layers of silicon, ceramic, resin and the like, or by injection-molding. Other method for forming the body 10 may also be used.

In addition, a protection device such as a Zener diode can be built in the body to protect the light emitting apparatus 100 from static electricity. The body 10 may also include a resistor and a capacitor according to the structure of the light emitting apparatus 100. Also, when the body 10 is made of silicon, the protection device, the resistor, and the capacitor may be configured in the form of an integrated circuit.

In addition, as shown in FIG. 1, the body 10 including the cavity 15 is opened upward. Also, when the body 10 is formed by accumulating a plurality of substrates, the cavity 15 can be formed during the accumulation of the substrates. When the body 10 is formed by injection molding, the cavity 15 may be formed during the injection molding. That is, the cavity 15 may be formed at the body 10 by patterning, punching, cutting, or etching during the accumulation process, or may be formed through a metal mold having the shape of the cavity 15 during the injection molding.

A high-reflective material may also be applied to a surface of the cavity 15. The high-reflection material may include metal such as Ag and Al. Further, the cavity 15 may take the form of a cup or a concave container, and an inner surface of the cavity 15 may be vertical or inclined. When the body 10 is made of silicon, the cavity 15 may be formed by performing wet-etching with respect to the body 10. In this instance, the inner surface of the cavity 15 may be inclined by approximately 50° to 70° with respect to an upper surface of the body 10. When the cavity 15 is formed by performing dry-etching with respect to the body 10, the inner surface of the cavity 15 may be inclined almost perpendicular to the upper surface of the body 10. In addition, the cavity 15 may have a circular, polygonal, or oval shape when seen from the above.

According to an embodiment of the present invention, the depth 'y' of the cavity 15 and the horizontal distance 'x' from the upper outer edge of the light emitting device 20 to the inner surface of the body 10 forming the cavity 15 are designed to have a predetermined relation with a height 'a' of the light emitting device 20 for reducing the color variation of the light emitted from the light emitting apparatus 100.

For example, the depth 'y' of the cavity 15 may be approximately 1.5 to 3 times as much as the height 'a' of the light emitting device 20. That is, the relation between the height 'a' and the depth 'y' preferably satisfy the <Expression 1> below.

$$1.5a \leq y \leq 3.0a \quad \text{<Expression 1>}$$

In addition, the horizontal distance 'x' from the upper outer edge of the light emitting device 20 to the inner surface of the body 10 forming the cavity 15 may be approximately 0.5 to 1.5 times as much as the height 'a' of the light emitting device 20. That is, the relation between the height 'a' and the distance 'x' preferably satisfy the <Expression 2> below.

$$0.5a \leq x \leq 1.5a \quad \text{<Expression 2>}$$

Also, a bottom area of the body 10 forming the cavity 15 may be equal to an area of the light emitting device 20 or, as far as the distance 'x' and the height 'a' satisfy the <Expression 2>, be greater than the area of the light emitting device 20.

The first and the second electrodes 31 and 32 also may be disposed on the body 10. More specifically, the first and the second electrodes 31 and 32 may be disposed not in the cavity 15 of the body 10 but on the outside of the cavity 15. For example, the first and the second electrodes 31 and 32 may extend from the upper peripheral surface of the body 10 to the lateral surface of the body 10.

Also, because the cavity 15 has a limited width as described above, the first and the second electrodes 31 and 32 may not be disposed in the cavity 15. In addition, the first and the second electrodes 31 and 32 may be manufactured by bonding a thin metal film onto the body 10 and patterning the thin metal film, or by forming a seed layer on the body 10 and plating the seed layer. Alternatively, the first and the second electrodes 31 and 32 may be manufactured by injection-molding a lead frame along with the body 10.

Further, the light emitting device 20 is mounted in the cavity 15. The light emitting device 20 may also be electrically connected with the first and the second electrodes 31 and 32 through first and second wires 41 and 42. The first and the second wires 41 and 42 may also be connected to the first and the second electrodes 31 and 32 by penetrating the first molding member 50. Therefore, the first and the second wires 41 and 42 may be partially exposed out of the first molding member 50. The light emitting device 20 may also be connected by die-bonding or flip-chip bonding, rather than the wire bonding method. Other methods may also be used.

Although the light emitting device 20 uses blue LEDs emitting blue light in this embodiment, other LEDs emitting red, green, white and so forth may be used as the light emitting device 20. Also, the light emitting device 20 may be an LED emitting ultraviolet (UV) rays. The types, the number, and mounting methods of the light emitting device 20 are not limited. Further, the molding member 50 may be provided in the cavity 15 so as to hermetically seal and protect the light emitting device 20. The first molding member 50 may also be made of silicon or resin.

As aforementioned, the depth 'y' of the cavity 15 and the horizontal distance 'x' from the upper outer edge of the light emitting device 20 to the inner surface of the body 10 forming the cavity 15 may be determined by the height 'a' of the light emitting device 20. Because the first molding member 50 is disposed in the cavity 15 having a restricted shape, the light emitting device 20 may maintain a relatively uniform thickness within the first molding member 50.

The first molding member 50 may also contain a fluorescent material, for example, a yellow fluorescent material. The yellow fluorescent material emits yellow light by being excited by the blue light from the light emitting device 20. In other words, the light emitting apparatus 100 may be able to simultaneously emit blue light by the light emitting device 20 and yellow light produced by the excited fluorescent material. Accordingly, a white light may be emitted by the combination of the blue light and the yellow light. However, the colors of the light emitted by the light emitting device 20 and the light produced by the excited fluorescent material are not limited.

In addition, because the light emitting device 20 sealed by the first molding member 50 has a relatively uniform thickness, the light emitted from the light emitting device 20 may have a uniform length of the emission path. As a result, the light emitting apparatus 100 is capable of emitting light causing little color variation.

Further, the second molding member 60 may be disposed on the body 10 and the first molding member 50. The second molding member 60 may also have a dome shape and seal the first and the second wires 41 and 42 exposed to the outside of the first molding member 50. In more detail, the second molding member 60 may have a light emitting surface in the dome shape, an upper surface of which is convex upward, to thereby improve the light extraction efficiency of the light emitting apparatus 100.

Figure 3:
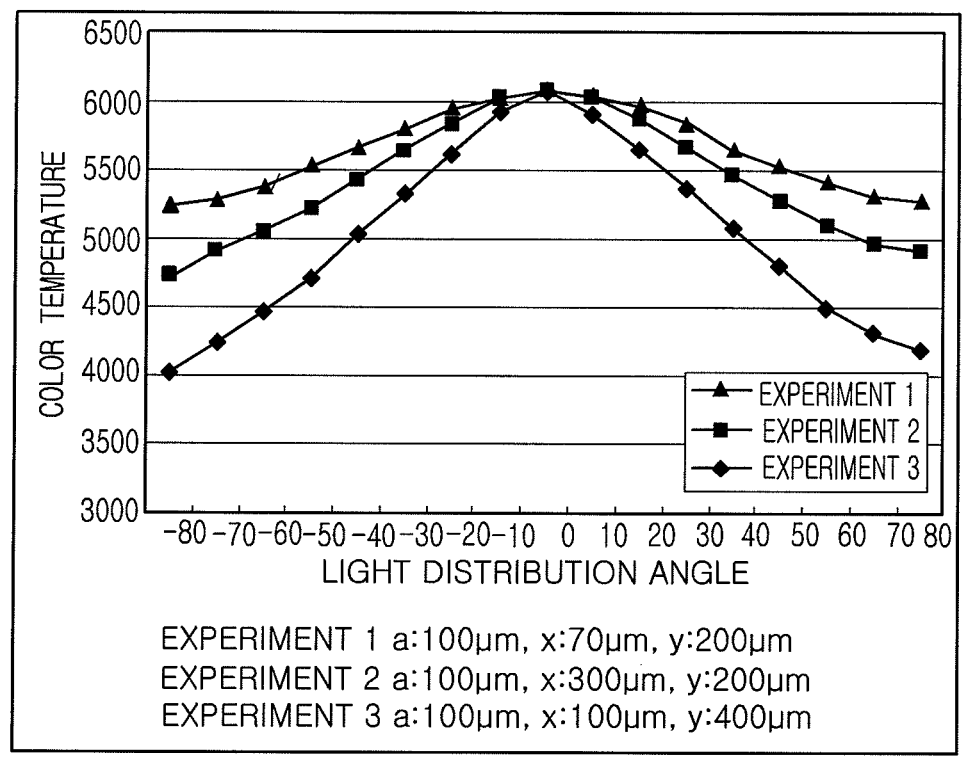
FIG. 3 is a graph showing color variation of light emitted from the light emitting apparatus of the first embodiment with respect to a luminous intensity distribution.

Next, FIG. 3 is a graph illustrating a color variation of the light emitted from the light emitting apparatus of the first embodiment with respect to a luminous intensity distribution. The light emitting apparatuses according to following embodiments also show similar color variation characteristic to the light emitting apparatus shown in FIG. 3.

Referring to FIG. 3, the x-axis of the graph represents a light distribution angle ranging approximately from −90° to 90°. When the light distribution angle is 0°, the light is emitted in an upward direction of the light emitting apparatus 100, that is, perpendicularly to a bottom surface of the body 10 forming the cavity 15 in FIG. 1. When the light distribution angle is −90° or 90°, the light is emitted in a lateral direction of the light emitting apparatus 100, that is, horizontally to the bottom surface of the body 10.

Further, the y-axis of the graph represents a color temperature of the light emitted from the light emitting apparatus 100, the color temperature ranging approximately from 3000K to 6500K. In the experiments, a light emitting apparatus having the color temperature of approximately 6000K when the light distribution angle is 0° was used. Also, the light emitting apparatuses experimentally used were designed to have all different values of the depth 'y' of the cavity 15 and the horizontal distance 'x' from the upper outer edge of the light emitting device 20 to the inner surface of the body 10 forming the cavity 15. The other conditions are all the same. Here, the height of the light emitting device 20 is 100 μm.

In the first Experiment 1, the distance 'x' is 70 μm belonging to the range of the 'x' value according to the embodiment, and The depth 'y' is 200 μm also belonging to the range of the value according to the embodiment. The variation of the color temperature of the light emitting apparatus 100, that is, the color variation is approximately 750K.

In the Experiment 2, the distance 'x' is 300 μm not belonging to the range of the 'x' value according to the embodiment, and the depth 'y' is 200 μm belonging to the range of the 'y' value according to the embodiment. Here, the color variation of the light emitting apparatus is approximately 1300K.

In the Experiment 3, the distance 'x' is 100 μm belonging to the range of the 'x' value according to the embodiment, and the depth 'y' is 400 μm not belonging to the range of the 'y' value according to the embodiment. Here, the color variation of the light emitting apparatus is approximately 2000K.

According to the experiment results, and as shown in FIG. 3, the color variation occurs the least in the light emitting apparatus 100 of Experiment 1, which is designed to satisfy conditions suggested in the embodiment. That is, the light emitting apparatus according to the first embodiment reduces the color variation.

Figure 4:
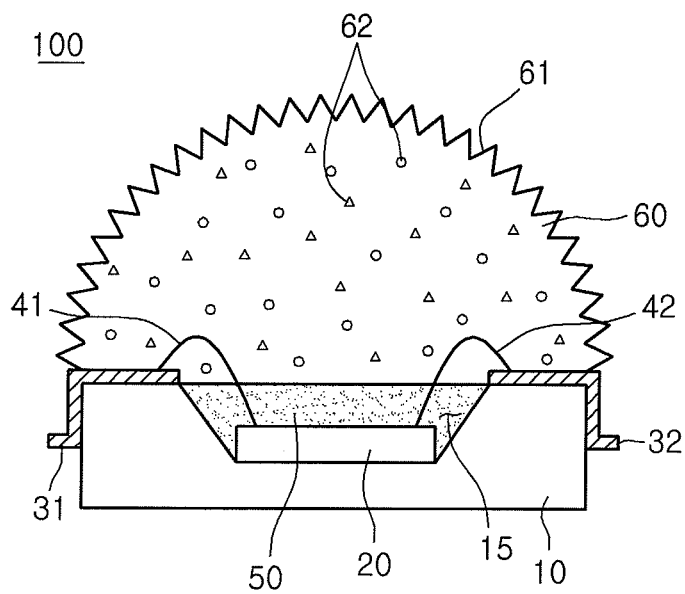
FIG. 4 is an overview illustrating a light emitting apparatus according to a second embodiment of the present invention.

Next, FIG. 4 is an overview showing a light emitting apparatus according to a second embodiment of the present invention. In describing the second embodiment, the same elements and structures as in the first embodiment will not be explained again.

As shown in FIG. 4, the light emitting apparatus 100 of the second embodiment has an uneven surface structure 61 formed at an upper surface of the second molding member 60 so as to enhance the light extraction efficiency. In addition, the second molding member 60 includes optical particles 62 including reflective particles, refractive particles, air bubbles, etc. for diffusing light.

Figure 5:
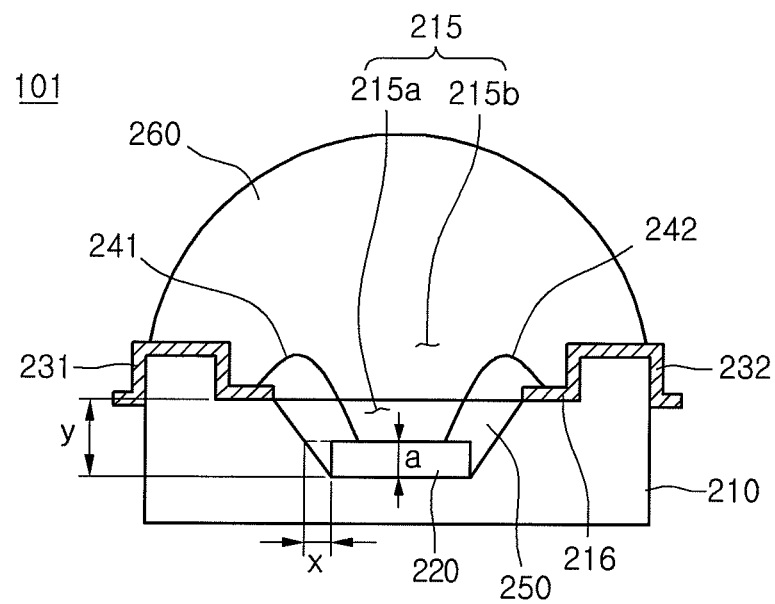
FIG. 5 is an overview illustrating a light emitting apparatus according to a third embodiment of the present invention.

Next, FIG. 5 is an overview showing a light emitting apparatus according to a third embodiment of the present invention. Referring to FIG. 5, the light emitting apparatus 101 of the third embodiment includes a body 210 including a cavity 215, a first electrode 231 and a second electrode 232 disposed on the body 210, a light emitting device 220 disposed in the cavity 215 of the body 210 and electrically connected with the first and the second electrodes 231 and 232, a first molding member 250 disposed in the cavity 215, and a second molding member 260 disposed on the first molding member 250 and the body 210.

The cavity 215 also includes a stepped part 216 is formed by a first cavity 215a and a second cavity 215b. In addition, the first and the second electrodes 231 and 232 may be disposed in the second cavity 215b (not in the first cavity 215a) and extend from the stepped part 216 toward an outer surface of the body 210.

A depth 'y' of the first cavity 215a and a horizontal distance 'x' from an upper outer edge of the light emitting device 220 to an inner surface of the body 210 forming the first cavity 215a is also determined by a height 'a' of the light emitting device 220 in order to reduce the color variation of the light emitting apparatus 100. Since this principle is explained in the first embodiment, a detailed explanation will be omitted. Thus, according to the embodiment shown in FIG. 5, the second molding member 260 may be disposed on the first molding member 250 and an uppermost peripheral surface of the body 210.

Figure 6:
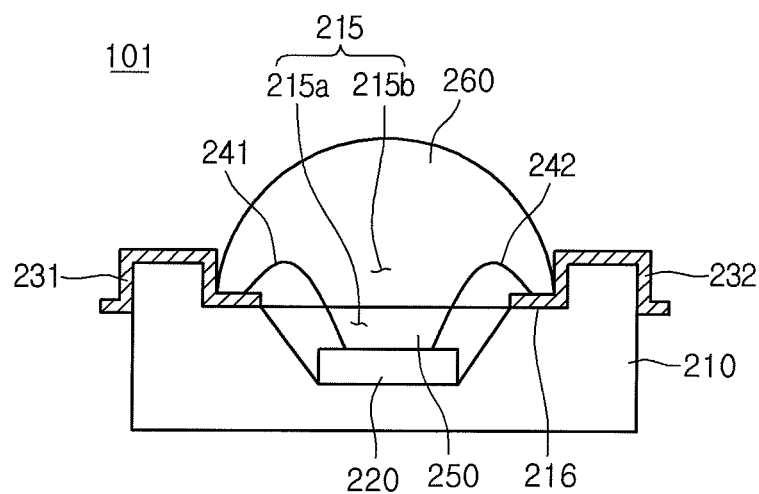
FIG. 6 is an overview illustrating a light emitting apparatus according to a fourth embodiment of the present invention.

Next, FIG. 6 is an overview showing a light emitting apparatus according to a fourth embodiment of the present invention. Referring to FIG. 6, the second molding member 260 of the light emitting apparatus 101 according to the fourth embodiment is disposed on the stepped part 216 and the first molding member 250, which is a difference from the third embodiment. In other words, the second molding member 260 is formed not on the uppermost surface of the body 210 but in the second cavity 215b and therefore has an area equal to or smaller than that of the second cavity 215b. The second molding member 260 also has a light emitting surface in a dome shape to enhance the light extraction efficiency.

Figure 7:
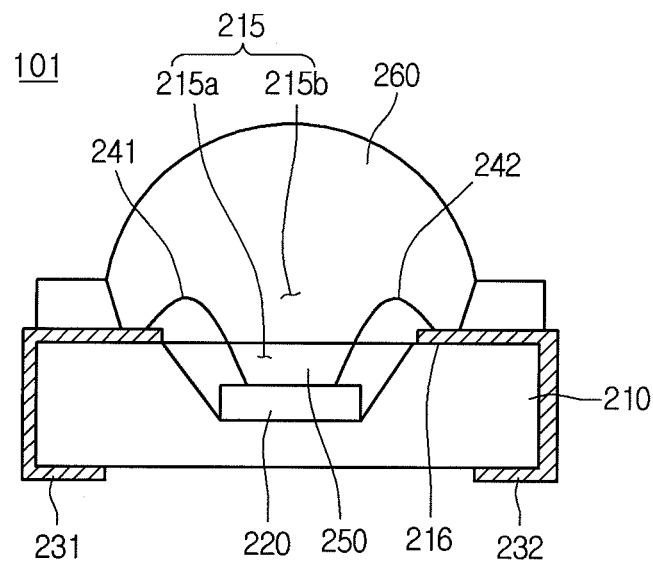
FIG. 7 is an overview illustrating a light emitting apparatus according to a fifth embodiment of the present invention.

Next, FIG. 7 is an overview showing a light emitting apparatus according to a fifth embodiment of the present invention. Referring to FIG. 7, the first and the second electrodes 231 and 232 of the light emitting apparatus 101 of the fifth embodiment are formed through the body 210, which is a difference from the fourth embodiment. Also, each of the first and the second electrodes 231 and 232 has one end disposed in the second cavity 215b and the other end extended to a bottom surface of the body 210 along an outer surface of the body 210.

Figure 8:
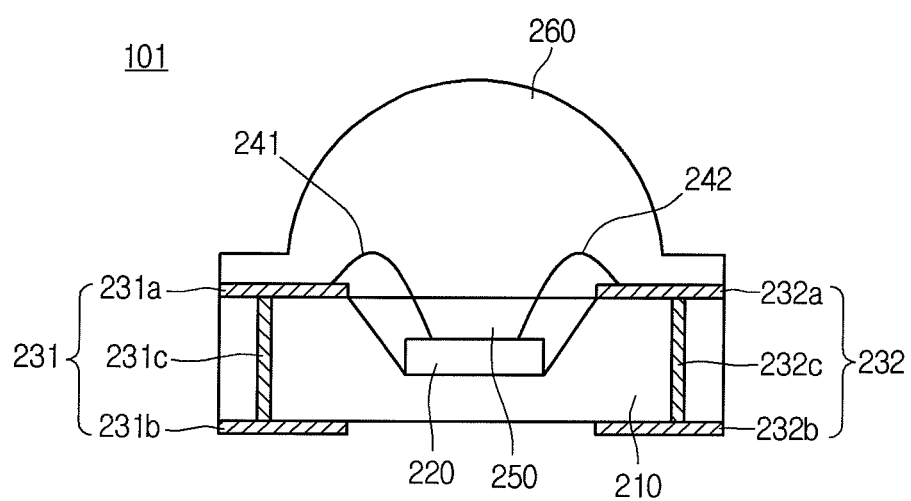
FIG. 8 is an overview illustrating a light emitting apparatus according to a sixth embodiment of the present invention.

Next, FIG. 8 is an overview showing a light emitting apparatus according to a sixth embodiment of the present invention. Referring to FIG. 8, differently from in the light emitting apparatus 101 of the fifth embodiment, the first electrode 231 includes an upper electrode 231a, a lower electrode 231b, and a through electrode 231c. Also, the second electrode 232 includes an upper electrode 232a, a lower electrode 232b, and a through electrode 232c.

Further, the upper electrodes 231a and 232a are disposed on an upper surface of the body 210 while the lower electrodes 231b and 232b are disposed on the bottom surface of the body 210. The through electrodes 231c and 232c may also take the form of a conductive pattern via penetrating the body 210 and electrically connecting the upper electrodes 231a and 232a with the lower electrodes 231b and 232b. The second molding member 260 also has an upper surface which is convex upward or at least partially flat.

Figure 9:
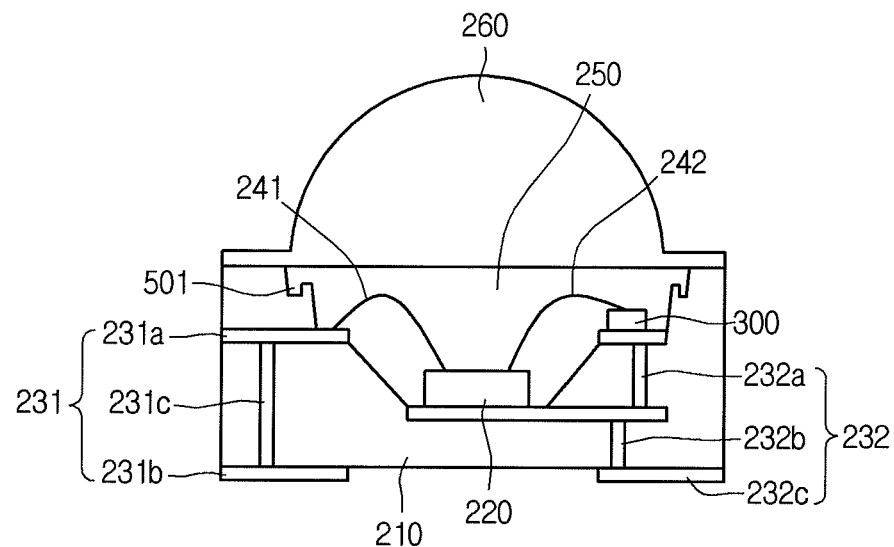
FIG. 9 is an overview illustrating a light emitting apparatus according to a seventh embodiment of the present invention.

Next, FIG. 9 is an overview illustrating a light emitting apparatus according to a seventh embodiment of the present invention. This embodiment is similar to the other embodiments, except the electrodes 231 and 232 include different shapes. For example, the first electrode 231 includes electrodes 231a, 231b and 231c having the structure and shape as shown in FIG. 9. The body 210 also has a step-shaped portion 501. A Zener diode 300 is also used in this embodiment.

Figure 10:
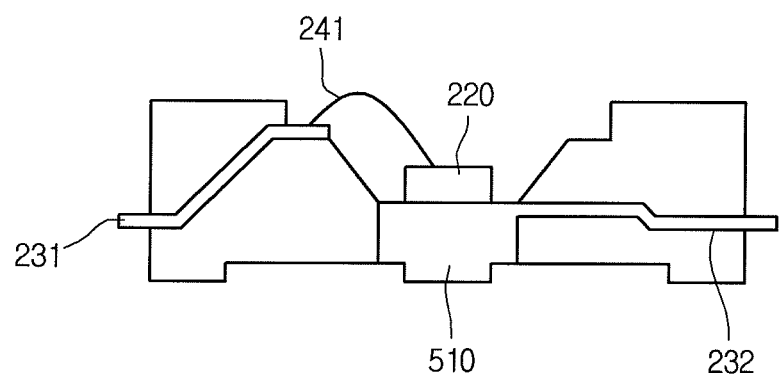
FIG. 10 is an overview illustrating a light emitting apparatus according to an eight embodiment of the present invention.

Next, FIG. 10 is an overview illustrating a light emitting apparatus according to an eight embodiment of the present invention. This embodiment is also similar to the other embodiments, except the arrangement of the electrodes 231 and 232. That is, the electrodes 231 and 232 have the structure and shape as shown in FIG. 10. Also, the electrode 232 expands in size under the LED 220 as acts as a heat sink 510. Only one wire 241 is also used in FIG. 10, because the second electrode 232 runs underneath the LED 220, and thus electrically connection can be made with the connection.

In the light emitting apparatuses according to the above embodiments, the depth 'y' of the cavity and the horizontal distance 'x' from the upper outer edge of the light emitting device to the inner surface of the body forming the cavity are designed to have a predetermined relation with the height 'a' of the light emitting device as described above so that color variation of the light emitted from the light emitting apparatus is reduced. As a consequence, the embodiments provide a light emitting apparatus capable of emitting light causing little color variation while achieving a high luminous efficiency.

In addition, a plurality of any of the light emitting apparatuses according to the embodiments may be arrayed on a substrate. Optical members including a light guide panel (LGP), a prism sheet, a diffusion sheet, and a fluorescent sheet may be arranged on a path of the light emitted from the light emitting apparatus. The light emitting apparatus, the substrate, and the optical members may serve as a backlight unit or a lighting unit. For example, a lighting system may include a backlight unit, a lighting unit, an indicator, a lamp, a street lamp, and so forth.

Figure 11:
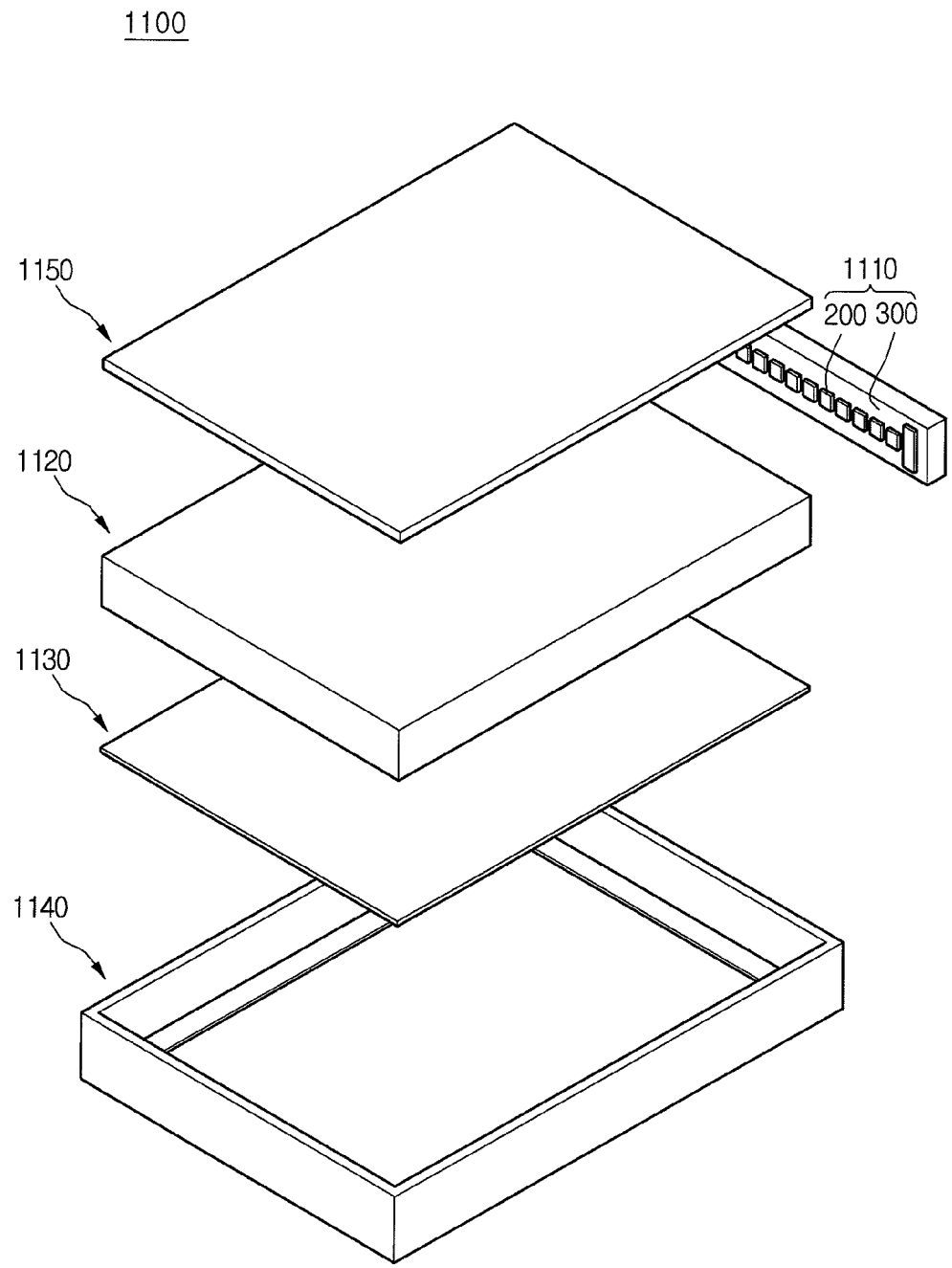
FIG. 11 is an overview illustrating a backlight unit employing the light emitting apparatus according to the embodiments of the present invention.

Next, FIG. 11 is an overview showing a backlight unit 1100 employing the light emitting apparatus according to the embodiments of the present invention. The backlight unit 1100 shown in FIG. 9 is introduced only as one example of the lighting system. That is, the lighting system employing the light emitting apparatus is not limited to the backlight unit.

Referring to FIG. 11, the backlight unit 1100 includes a bottom frame 1140, a light guide member 1120 disposed in the bottom frame 1140, and a light emitting module 1110 disposed on at least one lateral surface or on a lower surface of the light guide member 1120. In addition, a reflective sheet 1130 may be disposed at a lower part of the light guide member 1120.

The bottom frame 1140 may also have a box form with an open top side so as to receive the light guide member 1120, the light emitting module 1110, and the reflective sheet 1130. The bottom frame 1140 may also be made of metal or resin, but not limited thereto. The light emitting module 1110 also includes a substrate 300 and a plurality of the light emitting apparatuses 200 according to the embodiments mounted on the substrate 300. The plurality of light emitting apparatuses 200 supply light to the light guide member 1120.

As shown in FIG. 11, the light emitting module 1110 can be disposed on at least one of inner surfaces of the bottom frame 1140, and thus emitting light toward at least one of lateral surfaces of the light guide member 1120. However, the light emitting module 1110 may also be disposed at a lower part of the bottom frame 1140 to emit light toward the lower surface of the light guide member 1120. Such a configuration of the light emitting module 1110 is not limited but may be varied according to designs of the backlight unit 1100.

In addition, the light guide member 1120 may be disposed in the bottom frame 1140. The light guide member 1120 also converts the light supplied from the light emitting module 1110 into a surface light source and guides the light to a display panel. For example, the light guide member 1120 may include an LGP. The LGP may be made of any one selected from the group consisting of an acrylic resin base material such as polymethyl methacrylate (PMMA), polyethylene terephthalate (PET), poly carbonate (PC), cyclic olefin copolymer (COC), and polyethylene naphthalate (PEN).

An optical sheet 1150 is also disposed at an upper part of the light guide member 1120. The optical sheet 1150 may include at least one selected from a diffusion sheet, a light condensing sheet, a brightness enhancing sheet, or a fluorescent sheet. For example, the optical sheet 1150 may have a lamination structure consisting of the diffusion sheet, the light condensing sheet, the brightness enhancing sheet, and the fluorescent sheet.

According to this structure, the diffusion sheet evenly diffuses the light emitted from the light emitting module 110 and the diffused light is condensed to the display panel (not shown) by the light condensing sheet. The light emitted from the light condensing sheet is also randomly polarized. Here, the brightness enhancing sheet increases a degree of polarization for the light emitting from the light condensing sheet. For example, the light condensing sheet may include a horizontal and/or vertical prism sheet. The brightness enhancing sheet may also include a dual brightness enhancement film.

Also, the fluorescent sheet may include a light transmitting plate or film containing a fluorescent material. The reflective sheet 1130 may also be disposed at a lower part of the light guide member 1120. The reflective sheet 1130 thus reflects the light emitted through the lower surface of the light guide member 1120 toward a light emitting surface of the light guide member 1120. The reflective sheet 1130 may also be formed of resin having a high reflectance, for example, PET, PC, and polyvinyl chloride (PVC) although not limited thereto.

Figure 12:
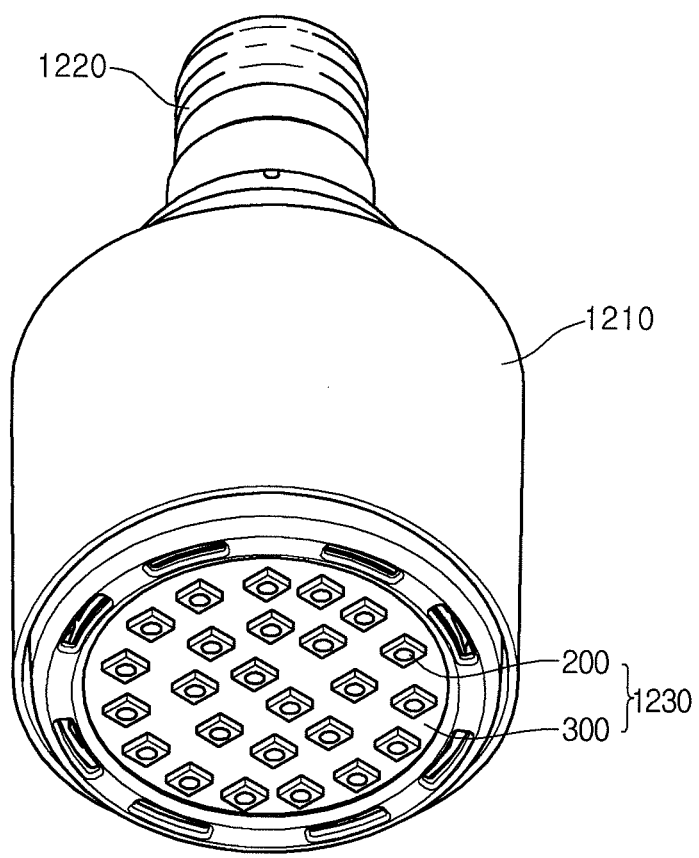
FIG. 12 is a perspective overview of a lighting unit using the light emitting apparatus according to the embodiments of the present invention.

Next, FIG. 12 is a perspective view of a lighting unit using the light emitting apparatus according to the embodiments of the present invention. The lighting unit 1200 of FIG. 12 is introduced only as one example of a lighting system. That is, the lighting system employing the light emitting apparatus is not limited to this lighting unit.

Referring to FIG. 12, the lighting unit 1200 includes a case body 1210, a light emitting module 1230 mounted to the case body 1210, and a connection terminal 1220 mounted to the case body 1210 to be supplied with power from an external power source. The case body 1210 is also preferably made of a material having s high heat radiation efficiency, such as metal or resin.

The light emitting module 1230 also includes the substrate 300, and at least one light emitting apparatus 200 according to the embodiments of the present invention, which is mounted on the substrate 300. The substrate 300 may also include an insulator printed with a circuit pattern. For example, the substrate 300 may include a general printed circuit board (PCB), a metal core PCB, a flexible PCB or a ceramic PCB. In addition, the substrate 300 may be formed of a material with a high reflectance or may have a surface in a highly reflective color such as white or silver.

At least one light emitting apparatus 200 according to the embodiments may also be mounted on the substrate 300. When plural light emitting apparatuses are used, each of the light emitting apparatuses 200 may include at least one light emitting diode (LED). The LED may include color LEDs emitting red, green, blue and white light, or UV LEDs emitting UV rays.

Further, the light emitting module 1230 may be configured to form various combination arrangements of the LEDs so that the desired color impression and brightness are achieved. For instance, a white LED, a red LED, and a green LED may be properly arranged to secure a high color rendering index (CRI). In addition, a fluorescent sheet may be further provided on a path of the light emitted from the light emitting module 1230 to change wavelength of the light. For example, when the light from the light emitting module 1230 has a blue wavelength band, the fluorescent sheet may contain a yellow fluorescent material. Therefore, the light emitted from the light emitting module 1230 and passed through the fluorescent sheet is finally seen as a white light.

The connection terminal 1220, being electrically connected with the light emitting module 1230, also supplies the light emitting module 1230 with power. Although the connection terminal 1220 is rotationally connected with the external power source by a socket connection method in FIG. 12, the connection method is not limited thereto. For example, the connection terminal 1220 may be inserted in the external power source by having a pin shape or be connected with the external power source through the medium of a wire.

The above-described lighting system obtains the desired optical effects by having at least one of the light guide member, the diffusion sheet, the light condensing sheet, the brightness enhancing sheet, and the fluorescent sheet arranged on the path of the light emitted from the light emitting module. As explained above, the lighting system employing the light emitting apparatus according to the embodiments of the present invention emits light with little color variation while achieving a high luminous efficiency.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art. Embodiments may also be selectively combined.

What is claimed is:

1. A light emitting apparatus, comprising:
a body including a first cavity and a second cavity disposed at an upper part of the first cavity, wherein a stepped part is formed between the first cavity and the second cavity;
a first electrode and a second electrode on the body;
a light emitting device disposed in the first cavity and being electrically connected with the first and the second electrodes; and
a first molding member disposed in the first cavity, and including a fluorescent material,
wherein a height 'a' of the light emitting device and a depth 'y' of the first cavity satisfy a relation $1.5a \leq y \leq 3.0a$,
wherein the height 'a' and a horizontal distance 'x' from an upper outer edge of the light emitting device to an inner surface of the body forming the first cavity satisfy a relation $0.5a \leq x \leq 1.5a$ and
wherein each of the first and second electrodes contact the stepped part and an upper surface and a lateral surface of the body.

2. The light emitting apparatus according to claim 1, further comprising:
a second molding member on the first molding member and the body.

3. The light emitting apparatus according to claim 2, wherein the second molding member includes an upward convex shape.

4. The light emitting apparatus according to claim 2, wherein an upper surface of the second molding member has an uneven surface structure.

5. The light emitting apparatus according to claim 2, wherein the second molding member includes optical particles including at least one of reflective particles, refractive particles, and/or air bubbles configured to diffuse light emitted by the light emitting device.

6. The light emitting apparatus according to claim 1, wherein the first molding member has a flat upper surface.

7. The light emitting apparatus according to claim 1, wherein the first and the second electrodes are disposed on an outside of the first cavity.

8. The light emitting apparatus according to claim 1, further comprising:
at least one wire electrically connecting the light emitting device with the first and the second electrodes.

9. The light emitting apparatus according to claim 8, wherein the wire is partially exposed to an outside of the first molding member.

10. The light emitting apparatus according to claim 1, wherein an inner surface of the body is inclined with respect to an upper surface of the body.

11. The light emitting apparatus according to claim 1, wherein the first and the second electrodes penetrate the body and extend to an outer lateral surface or a bottom surface of the body.

12. The light emitting apparatus according to claim 1, wherein the first and the second electrodes are partially disposed on a bottom surface of the body.

13. The light emitting apparatus according to claim 1, wherein the first and the second electrodes each have one end disposed in the second cavity.

14. The light emitting apparatus according to claim 1, wherein the light emitting device includes a blue light emitting diode (LED) emitting blue light, and the fluorescent material includes a yellow fluorescent material emitting yellow light by being excited by light emitted from the blue LED.

15. The light emitting apparatus according to claim 1, wherein the height of the stepped part is lower than the upper surface of the body.

16. A lighting system, comprising:
a light emitting module including a substrate and a light emitting apparatus mounted on the substrate,
wherein the light emitting apparatus includes a body including a first cavity and a second cavity disposed at an upper part of the first cavity; a first electrode and a second electrode on the body; a light emitting device disposed in the first cavity and being electrically connected with the first and the second electrodes; and a first molding member disposed in the first cavity, and including a fluorescent material,
wherein a stepped part is formed between the first cavity and the second cavity,
wherein a height 'a' of the light emitting device and a depth 'y' of the first cavity satisfy a relation $1.5a \leq y \leq 3.0a$,
wherein the height 'a' and a horizontal distance 'x' from an upper outer edge of the light emitting device to an inner surface of the body forming the first cavity satisfy a relation $0.5a \leq x < 1.5a$, and
wherein each of the first and the second electrodes contact the stepped part and an upper surface and a lateral surface of the body.

17. The lighting system according to claim 16, wherein at least one of a light guide member, a diffusion sheet, a light condensing sheet, a brightness enhancing sheet, and/or a fluorescent sheet is disposed on a path of light emitted from the light emitting module.

18. The lighting system according to claim 16, wherein the lighting system is a backlight unit.

19. The lighting system according to claim 16, wherein the lighting system is a lighting unit.

20. The lighting system according to claim 19, wherein the lighting unit includes a case body to which the light emitting module is mounted, and a connection terminal mounted to the case body and supplied with power from an external power source.

* * * * *